United States Patent [19]
Kügler

[11] Patent Number: 5,423,970
[45] Date of Patent: Jun. 13, 1995

[54] APPARATUS FOR REACTIVE SPUTTER COATING AT LEAST ONE ARTICLE

[75] Inventor: Eduard Kügler, Feldkirch-Tisis, Austria

[73] Assignee: Balzers Aktiengesellschaft, Liechtenstein

[21] Appl. No.: 164,908

[22] Filed: Dec. 10, 1993

Related U.S. Application Data

[62] Division of Ser. No. 865,116, Apr. 8, 1992, Pat. No. 5,292,417.

[30] Foreign Application Priority Data

Apr. 12, 1991 [CH] Switzerland ............... 1095/91

[51] Int. Cl.$^6$ ............................................. C23C 14/54
[52] U.S. Cl. ..................... 204/298.03; 204/298.07; 204/298.08; 204/298.26; 204/298.28
[58] Field of Search ............... 204/192.13, 192.25, 204/298.03, 298.07, 298.08, 298.26, 298.28

[56] References Cited

U.S. PATENT DOCUMENTS

| | | | |
|---|---|---|---|
| 4,420,385 | 12/1983 | Hartsough | 204/192.27 |
| 4,931,169 | 6/1990 | Scherer et al. | 204/298.11 |
| 5,026,471 | 6/1991 | Latz et al. | 204/298.19 |
| 5,154,810 | 10/1992 | Kamerung et al. | 204/192.13 |

Primary Examiner—Aaron Weisstuch
Attorney, Agent, or Firm—Louis Weinstein

[57] ABSTRACT

An apparatus for performing the method comprising a vacuum treatment chamber containing a target of ohmic conductive material. The target and workpiece are supported by suitable electrodes. Superimposed DC and AC power is applied to generate a glow discharge in the chamber in which the target is sputtered. Particles sputtered off the target react with a reactive gas in the space between the target and workpiece and the reaction product is deposited upon the workpiece. The operating parameters of the system are selected so that sputtering and deposition are performed in an unstable transition mode between a metallic and a reactive mode whereby particles are deposited on the workpiece to form a layer on the workpiece of lower conductivity than the target material. A feedback arrangement is preferably utilized to maintain operation with the aforesaid unstable transition mode.

19 Claims, 5 Drawing Sheets

APPARATUS FOR REACTIVE SPUTTER COATING AT LEAST ONE ARTICLE

This is a Division of application Ser. No. 07/865,116, filed Apr. 8, 1992, now U.S. Pat. No. 5,292,417 issued Mar. 8, 1994.

FIELD OF THE INVENTION

The present invention relates specifically to a method of coating at least one substrate with a layer, wherein an ohmically conductive target is sputtered in a glow discharge and the sputtered particles are made to react with a gas in the space between the target and the substrate and are deposited on the substrate, wherein the coating process is operated in the unstable transition mode between the metallic and the reactive mode and wherein the electrical conductivity of the deposited layer is lower than that of the material of the target, said layer being dielectric in the extreme case. The invention relates also to an apparatus for practicing the method.

DESCRIPTION OF THE PRIOR ART

From the article (1) "Deposition of Tantalum and Tantalum Oxide by Superimposed RF and DC Sputtering", F. Vratny, *J. ELectrochem. Soc.; Solid State Science,* May 1967, it is known to produce dielectric coatings on workpieces by rf sputtering of dielectric target materials in a glow discharge.

The article also discloses sputtering of metal targets for coating purposes by direct current (DC) and, superimposed thereon, rf current, thereby reacting the sputtered particles with a gas to form a dielectric layer upon the article to be coated.

In this article, the disclosure of which is considered as an integral part of the present specification and is herewith incorporated by reference, it is set forth that by using an rf current for sputtering, arcing is prevented which may occur due to the reaction products being deposited on the metal target and forming an insulating layer thereon. Such arcing leads to disturbances of the coating process by irregularities in time or by splashes or may even lead to breakdown of the sputtering process.

In the above-mentioned Vratny article (1), it is recognized that the coating rate at the workpiece is higher when sputtering is effected by direct current and superimposed rf current than in the case of direct current sputtering alone. As rf, a frequency of 13.56 MHz is used.

Regarding coating of workpieces with a dielectric layer by a so-called rf magnetron sputtering of a dielectric target, reference is made to the article (2) "Magnetron Sputtering of $SiO_2$; An Alternative to Chemical Vapor Deposition", Karel Urbanek, *Solid State Technology,* April 1977. Here, too, an rf signal of 13.56 MHz is used.

The problems which occur when a metal target plate is DC-sputtered and the sputtered particles are reacted with a gas for producing a dielectric coating, such as already mentioned in the above-mentioned article (1) of Vratny, are described in the German Published Specification DE-OS-25 13 216 (3). It is described in this specification, which is also incorporated by reference into this disclosure that rf current is used for sputtering if a target of a non-conductive material is to be sputtered.

Further, the possibility of superimposing rf and DC for sputtering is mentioned for increasing the sputtering rate also at a metal or a generally conducting target. It is explained that by so-called magnetron sputtering, the sputtering rate can be increased. It is also explained that arcing at target areas which become coated with an insulating layer—become "poisoned"—, may be substantially prevented, such as already explained in the Vratny article (1), by superimposing an alternating current for the sputtering. Frequencies of 400 Hz to 60 kHz are used.

In the article (4), "Reaktives DC-Hochratezerstäuben als Produktionsverfahren" (Reactive DC-High Rate Sputtering As Production Method) of S. Schiller et al., presented at the International Conference on Metal Coating, San Diego, Calif., March 1987, *Surface and Coating Technology* 33 (1987), reactive DC-sputtering for coating of workpieces is extensively discussed. Especially the hysteresis behavior of such a reactive DC-sputtering and coating process is explained.

When a metallic target is DC-sputtered and the mass flow rate of a reacting gas to the glow discharge space between target and workpieces is continuously increased, the partial gas pressure slightly rises and the sputtering rate slightly decreases, as is already known from the Vratny article (1). During this initial phase the consumption of the reactive gas is almost complete and decreases thereafter, such that the partial pressure of the reactive gas increases much less than its mass flow, i.e. the amount of reactive gas fed per unit of time to the process space.

In this process range, termed "metallic mode", the reactive DC-sputtering/coating process is stable. At a threshold value of the above-mentioned mass flow the partial pressure of the reactive gas suddenly rises to a substantially higher value. Simultaneously, the consumption of the reactive gas suddenly decreases to a lower value, and the sputtering rate suddenly decreases to a drastically reduced value. This range of sudden changes is termed "transition mode". When the mass flow of the reactive gas into the process space is further increased, the partial pressure again follows a stable characteristic—the "reactive mode"—, also the reactive gas consumption and the now substantially reduced sputtering rate. This behavior will be discussed in more detail when discussing the DC-sputtering.

Whereas at a reactive gas mass flow below the mentioned critical threshold value, substantially metallic particles are sputtered from the target and react with the reactive gas, a substantial amount of target poisoning occurs when crossing said critical value, i.e. the conducting or metallic target becomes at least partly coated with a less conductive or even dielectric layer. Significantly less metal particles are sputtered off, such that less reactive gas is consumed and, therefore, its partial pressure rises considerably. The sputtering rate decreases drastically. Upon decrease of the reactive gas mass flow, departing from the reactive mode, the process transits back into the metal mode, but with a pronounced hysteresis behavior.

The Schiller et al. article (4), which also shall be incorporated herein by reference, discloses, as already known from Vratny (1), that the sputter rate decreases at an increasing reactive gas partial pressure, and that, furthermore, the rate of the reaction $\gamma = y/x$ of the deposited compound $Me_xR_y$ increases at an increasing reactive gas partial pressure.

In the Schiller et al. article (4), it is concluded that if a dielectric layer is to be deposited at a high rate, it is necessary to operate with a high plasma density of the glow discharge close to the workpiece and normally in the transition mode.

In the Schiller et al. article (4), measures are discussed as to how a DC-process can be stabilized in the unstable range, namely, the transition mode, by means of an external, fast acting negative feedback control circuit which especially uses a plasma emission monitor (PEM) as an actual value sensor and actual value converter and a fast operating valve for regulating the reactive gas mass flow.

The article (5), "Possibilities of Silicon Oxide Deposition in Vacuum Web Coating", among others by the same author, S. Schiller, as of the previously mentioned article (4), from the 3rd International Conference on Vacuum Web Coating, San Antonio, Tex., November 1989, discloses that with reactive DC-sputtering of a metal target and thereby realizing a high rate of oxidation of the coating, the coating rate is so low that industrial exploitation can hardly be considered. With regard to the rf-sputtering of a dielectric target—an $SiO_2$ target—it is recognized that extremely high rf-power is needed, which in turn causes high costs, hardly reasonable for corresponding production facilities, so that rf-diode-sputtering is not considered industrially exploitable.

The conclusion of article (5) is that efforts for coating of workpieces by dielectric layers—$Sio_x$—should be directed to electron beam evaporation processes of dielectric targets.

U.S. Pat. No. 4,851,095 (6) discloses a method which follows substantially the teachings of article (4), "Reactive DC-High Rate Sputtering", namely, to deposit a coating onto a workpiece by DC-sputtering in a first process area at a relatively low reactive gas partial pressure, and to post-react, in a second process area, the insufficiently reacted coating which is due to the relatively low partial pressure, at a higher reactive gas partial pressure, namely, at a value which, when applied to the sputtering process, would lead to its transition into the reactive mode.

Therefore, the workpiece is moved through the mentioned process areas by fast rotation which necessitates large mechanical efforts. Besides large expenditures for mechanical construction, this approach is disadvantageous because of the large changes of stoichiometry with time at the growing layer.

As does the Vratny article (1), the European Published Specification EP-A-0 347 567 (7) disclosed sputtering by DC and rf, by means of which the basic stability of the process operating point in the metallic mode, i.e. its "distance" from the transition mode is claimed to be increased. The cathode-voltage/cathode-current characteristic of the discharge is thereby considered.

SUMMARY OF THE INVENTION

A general object of the present invention is to provide a method in which, in contrast to the prior art,
(a) an at least substantially homogeneous stoichiometric coating is achieved;
(b) a high coating rate is obtained; and
(c) a high as possible efficiency with respect to sputtering power, use of reactive gas, and expenditure for the apparatus is obtained.

This general object is obtained by a method for coating at least one object with at least one layer, wherein an ohmically conductive target is sputtered in a glow discharge, which glow discharge is electrically supplied by a DC-signal and a superimposed AC-signal, and wherein the sputtered particles react with a gas in a space between said target and said object and are deposited on said object, further wherein the layer deposition process is controlled in the unstable transition mode between the metallic and reactive modes, whereby said layer deposited on said object is electrically less conductive than the material of said target.

Such a method is performed by a coating apparatus which comprises an ohmically conductive cathodic target, an anode, a source of electric energy supplying said anode and cathode for generating a glow discharge therebetween, an object or workpiece carrier, at least one gas inlet in the space between the object carrier and the target arrangement, means which stabilize sputtering and layer deposition operation of said apparatus in the unstable transition mode, and wherein said electric source provides for DC-current with superimposed AC-current.

By proceeding according to the said method, thus primarily combining:
the operation of the glow discharge by DC and superimposed AC, and
operating the layer deposition process in the unstable transition mode.

Non-conductive or hardly conductive layers are deposited on workpieces with a higher rate of reaction, further with a good ratio of energy yields which is given by the deposited layer volume per sputtering energy used therefor, divided by a metal layer volume deposited by non-reactive operation from a metal target per sputtering energy thereby employed. The inventively produced layers are deposited with a high deposition rate so that the said method may be implemented in commercial production. That in the said transition mode and at high rates of reaction, high deposition rates may be achieved is probably based in that, as will be shown later, the transition mode of a layer deposition process, at least operated according to the said method, departs from expected well-known characteristics, in that it has been recognized that with the inventive method the sputtering rate increases as the mass flow of the reaction gas increases in the transition mode, along at least substantial ranges within that mode, and that the partial pressure of the reaction gas is kept substantially constant as said mass flow rises along considerable ranges of said transition mode.

It is preferred that said method is performed so that the energy yield ratio, defined by the inventively produced layer volume per sputtering energy, divided by a metal layer volume of a non-reactively deposited layer from a sputtered metal target, per sputtering energy used in the latter case, becomes greater than or equal to 1, thereby preferably greater than 1.

Thus, when a layer is deposited according to the inventive method, it is even possible to reach a higher energy exploitation or yield than when a metal layer is deposited in a non-reactive operation.

It is known from the EP-A-0 416 241 to deposit a layer on a workpiece in a process wherein an ohmically conductive target is sputtered in a glow discharge and the sputtered particles are reacted with a gas in the space between the target and the workpiece and are deposited on the workpiece. Specially designed target arrangements are provided for enabling such a method to be stably operated and for achieving a high deposition rate and a good quality layer.

In the above reference, the use of DC, AC or DC with superimposed AC is described as being exchangeable. As an AC-signal there is used an rf-signal.

In contrast thereto, the present invention departs therefrom with the recognition that with the combination of DC and AC for electrically supplying the glow discharge and with operation of the process within the transition mode, problems which are known to occur with DC-sputtering are eliminated, with significantly less AC-power compared with the power which must be used for pure AC (rf) glow discharge operation.

By the inventive method and operation of the glow discharge with DC and superimposed AC, the sputtering rate is increased and the efficiency of the method is optimized with regard to electrical power and mass flow of reactive gas. Additionally, the result is achieved that by operating the process closer to the metallic mode than to the reactive mode, a considerably increased reaction rate of the layer is achieve, at optimal efficiency, by adding an AC-signal component with a power of 10 percent to 80 percent, preferably 10 percent to 50 percent of the DC-power, to the DC-signal.

As was mentioned, the surprising result that homogeneous stoichiometric layers may be deposited with a high deposition rate and with good efficiency in the transition mode, may probably be explained by the unexpected behavior of the process inventively performed in the transition mode, in which the sputtering rate rises with rising mass flow of the reaction gas, at least along ranges of said transition mode and especially along extended such ranges, and that thereby in these ranges the partial pressure of the reactive gas is substantially constant as a function of said mass flow of the reactive gas.

With the inventive method mentioned above, in which, further, said AC-signal comprises a spectral component which is dominant with respect to power within the medium frequency range, preferably between 50 Hz and 250 kHz (both inclusive), especially preferred between 10 kHz and 200 kHz (both inclusive), and whereby said spectral component may also be located in a frequency range between 50 Hz and 500 Hz or even at a frequency down to 10 Hz. Generation of the AC-signal at these frequencies is easier compared to rf-signal generation.

The feature that a spectral component, dominant with respect to power, is disposed in the said frequency ranges means that it is clearly possible to use signals with spectral components at higher and/or lower frequencies as may be encountered at most distorted sine signals, thereby especially at square impulse signals, possibly comprising also lower frequency components superimposed thereon.

The hysteresis, such as described in the article (4) "Reactive DC-High Rate Sputtering" for DC-sputtering is shifted by the inventive application of AC and DC-sputtering to higher ranges of reactive gas mass flow, so that the metallic mode and the transition mode are extended or shifted to reactive gas partial pressure ranges at which, in comparison with DC-sputtering, increased reaction rates are achieved at an at least equal sputtering and coating rates as in DC-sputtering.

It becomes further possible to set the location and/or abruptness of transition from the metallic mode to the reactive mode by the applied AC-signal, its power, and/or its frequency.

Because the working point (quiescent point) of the process is stabilized, preferably by a negative feedback control loop in the unstable transition mode closer to the metallic mode, it becomes further possible to realize a surprisingly high reaction rate at a high sputtering and thus deposition rate, namely, at a higher sputtering rate than that which may be achieved by DC-sputtering. The process working point may be set within the transition mode up to close to the reactive mode, if desired.

So as to be able to stabilize the operating point of the process at each desired point within the transition mode and substantially independent from its local course and also near to the reactive mode, if desired, it is further proposed to provide negative feedback control by measurement of the instantaneous state or value of the process, comparing the said state or value with a preselected control state or value and to act, depending upon the result of said comparison, on a regulation member of the said process for negative feedback control of the location of the process operating point. Thereby the gain of the open loop of the negative feedback control loop is chosen to be significantly larger than unity up to frequencies which correspond to frequencies of disturbance signals which act on the process and which could significantly influence the location of its operating point. By these measures drift of the working point of the process into the metallic or into the reactive mode is prevented.

By the fact that the transfer function of the open loop, which is, as known, measured between the input for the control value (rated value) and the controlled value which, in a closed loop configuration is fed back to the comparing unit, has a value significantly larger than unity, up to the said frequencies, shifting is prevented that the operating point of the process by shifted out of its preset position, even for a short period of time, by the influence of disturbance signals, which disturbance signals are compensated for by action of the negative feedback control loop with a short settling time. Thus, by these measures, it is ensured that the process working point, which is inventively set within the transition mode, will stably remain as set.

With regard to pure AC-sputtering, reference is made to the modeling of reactive sputtering processes of S. Berg et al. in the articles, (8, 9) "Modeling of Reactive Sputtering of Compound Materials", *J. Vac. Sci. Technol. A*5, (2), 1987, and "Process Modeling of Reactive Sputtering", *J. Vac. Sci. Technol. A*7, (3), June 1989, which disclosures are incorporated into this specification by reference.

A further pertinent prior art document is "Patent Abstracts of Japan" Vol 12 No 353 (C-530) (3200), Sep. 21, 1988, and Japanese Laid-open Patent Application A-63 111 173 (Anelva Corp.), May 16, 1988 (see abstract).

According to a further embodiment, it is proposed, in order to further increase the efficiency to sputter the target by magnetron sputtering, i.e. to increase, as is known, the plasma density at the target by means of magnetic fields.

With the inventive method it is, as previously mentioned, possible to produce stoichiometric layers with a layer deposition process operated in the transition mode, with a high deposition rate and in a most advantageous manner. For increasing the reaction rate also in cases where this rate is $<<1$, it is proposed to post-react the deposited layer in an atmosphere of the reactive gas.

It has further been recognized that, principally, when reactive AC and DC-sputtering a target of low electric conductivity, such as and especially as of Si, which is doped in order to increase its conductivity, doping by phosphorus leads to a significantly lower tendency of arcing and splashing at a "poisoned" target, which allows sputtering at higher power than with otherwise doped targets without falling into the reactive mode.

The targets, especially Si-targets which are used in accordance with the invention, further preferably have an electrical conductively in the range of 0.01 to 100 Ωcm, preferably of 0.01 to 1 Ωcm.

Fast moving of the workpieces or substrates is not necessary. It nevertheless may be of advantage to slowly move the workpieces in the process and/or a post reaction area, e.g. at a revolution speed of $\leq 1$ Hz, such as, for example, of 0.5 Hz.

By proceeding in accordance with the present invention, it becomes possible to apply the sputtering technique for the production of low conductive, up to dielectric layers, which satisfy highest quality demands, such as for optical devices. Such a layer deposition or coating was prior to the method of the present invention, predominantly (and economically justifiable) only possible by means of evaporation processes, i.e. processes which are much less suited for an automatic industrial production than sputtering.

BRIEF DESCRIPTION OF THE FIGURES

The invention will be better understood and objects other than set forth above, will become apparent when consideration is given to the following detailed description thereof. Such description makes reference to the annexed drawings, wherein.

DETAILED DESCRIPTION OF THE INVENTION AND PREFERRED EMBODIMENTS THEREOF

Figure 1:
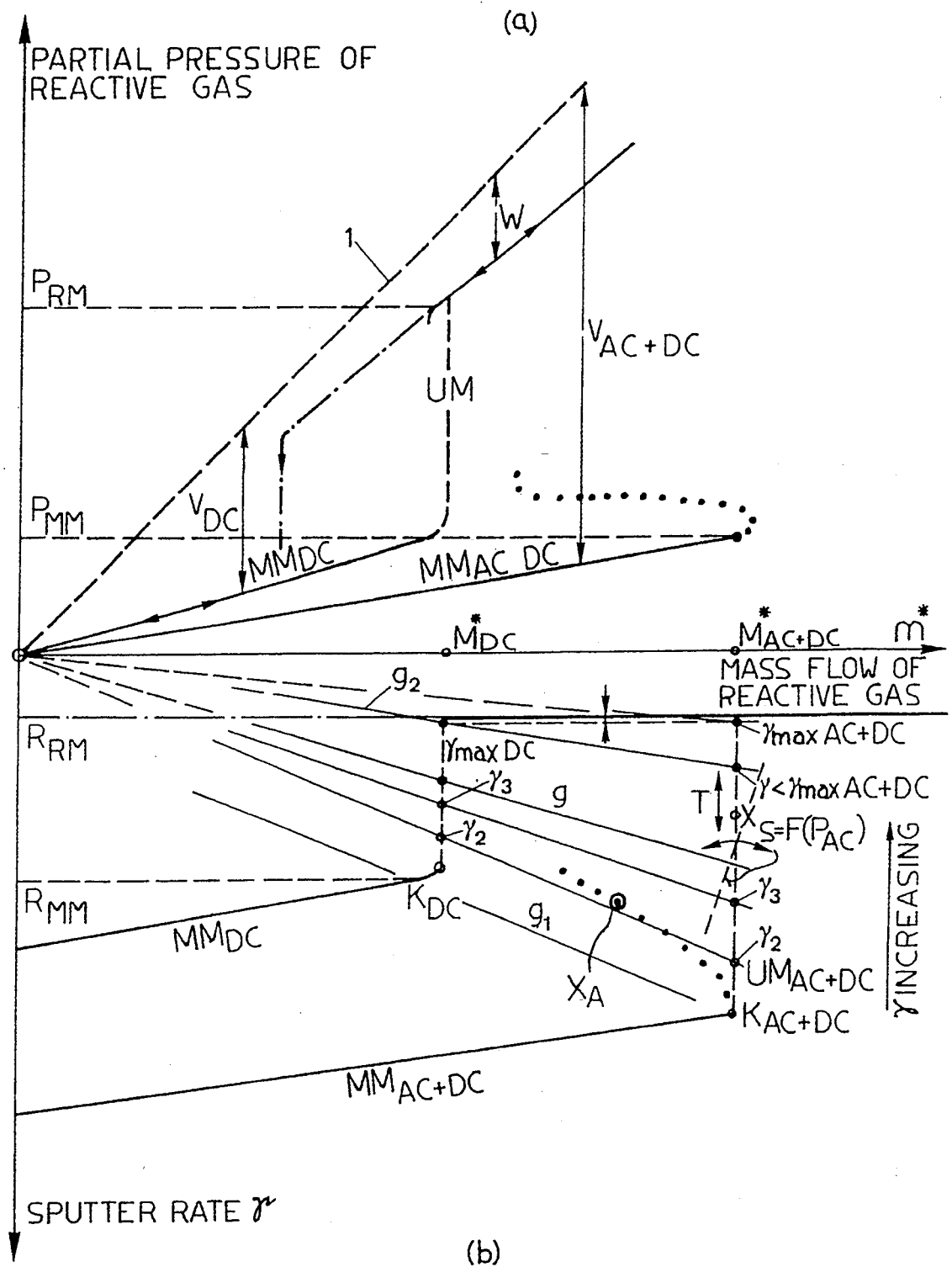
FIG. 1 illustrates the procedure according to the invention based on qualitative characteristics of a layer deposition process.

Based on FIG. 1, initially the procedure according to the invention will be discussed on purely qualitative hysteresis curves of a coating process for dielectric layers, which process comprises reactive sputtering of a conductive or metallic target. The illustration and also the following explanations do not claim to be of scientific exactness.

They are based, first, on known characteristics which will allow a first comprehension of process behavior. It is only afterwards that reference is made to surprisingly different process behavior as a result of the method according to the present invention. These novel characteristics will then lead to a deepened comprehension of the advantages which are inventively realized.

It is thus the aim to show which effects are probably and inventively exploited to reach the results according to the invention.

In the illustration (a), the horizontal axis represents the "mass flow of the reaction gas" m* into the process space between the sputtered target and the workpiece, and the vertical axis represents qualitatively the partial pressure p of reaction gas. Without glow discharge in the process space, i.e. without operating the coating process, the partial pressure p would increase linearly as a function of the mass flow m* such as indicated by the broken line 1. If now a DC-glow discharge is ignited in the reaction space and the target is DC-sputtered, a large portion of the reactive gas fed in is consumed by reaction with the sputtered particles, corresponding to the value $V_{DC}$ according to the illustration (a), up to a critical mass flow value $M^*_{DC}$. This leads to coating of the workpiece by the dielectric reaction product.

When, during the DC-sputtering, the mass flow of the reactive gas reaches the above-mentioned critical value $M^*_{DC}$, the partial pressure suddenly increases from the value PMM, in the metallic mode MM, to the substantially higher value $P_{RM}$ in the reactive mode RM. Upon further increase of the mass flow m* of the reactive gas, the partial pressure p of the reactive gas further increases at a substantially increased level. This second, stable operating range of the characteristic curve is that of the reactive mode RM. The unstable range as shown in dashed lines in FIG. 1a is the transition mode UM.

In the reactive mode an amount of reactive gas corresponding to the amount W, which is substantially independent from the mass flow, is consumed by reaction. A dielectric layer has been deposited on the target. The layer on the workpiece. or article is further transformed by further reacting with the reactive gas. The normal reaction process hardly occurs any longer and reaction product particles are directly sputtered off the target. For the coating of the workpiece this stable range RM is, at least for the object of interest in this application, not, or as mentioned, extremely uneconomically exploitable due to the above-mentioned poisoning of the target by its dielectric coating.

The characteristic hysteresis plot is qualitatively shown by the dash-dotted curve which is obtained when, proceeding from the reactive mode RM, the mass flow m* is reduced until the process falls back into the metallic mode MM. The typical hysteresis behavior is recognized, which is believed to occur up to now.

In the illustration of FIG. 1b the variation of the sputter rate r (increasing rate extends downwards) is shown as a function of the mass flow m* of the reactive gas. At an increasing mass flow m* in the metallic mode $MM_{DC}$ the sputter rate r decreases. Thus, it becomes evident that the reaction rate $\gamma$ of the sputtered particles increases with increasing mass flow. This is because the sputter rate r decreases according to FIG. 1b and according to FIG. 1a the portion of reacted reaction gas increases simultaneously corresponding to the amount $V_{DC}$.

At the critical mass flow level $M^*_{DC}$, the sputtering rate suddenly decreases from $R_{MM}$ in the metallic mode to a substantially lower value $R_{RM}$ and remains, now in the reactive mode, substantially constant. When the target is poisoned, particles of the poisoning dielectric layer which has been formed on the metallic target are sputtered off and are deposited on the workpiece, which particles consume hardly any further reactive gas in the process space. When the target is completely covered by such layer, the DC-sputtering process substantially breaks down.

When the glow discharge and thus sputtering are operated by DC with a superimposed AC portion of a relative low power—of substantially lower power than needed for exclusively AC-sputtering—a significant increase of the sputter rate r occurs at respective equal mass flow values of the reactive gas and the coating rate is correspondingly increased.

This corresponds in the illustration of FIG. 1b to the curve MM (AC+DC). As the sputtering rate r is increased by superimposing AC at an unchanged mass flow m* of the reactive gas, the reacting portion of the reactive gas increases and the partial pressure of the reactive gas in the metallic mode MM (AC+DC) increases much less with increasing mass flow m, than in the DC case. The portion of the reactive gas fed in which, with superimposed AC, reacts with sputtered particles is shown in illustration FIG. 1a by the amount $V_{AC+DC}$.

It is the partial pressure p of the reactive gas in the process space which is substantially decisive whether the process falls from the stable metallic mode MM through the transition mode UM into the reactive mode RM. The threshold value $P_{MM}$ of the partial pressure is decisively reached later with superimposed AC, i.e. at a substantially higher mass flow $M^*_{AC+DC}$ of the reactive gas than $M^*_{DC}$ at a pure DC-sputtering.

This shows that one step applied in accordance with the invention, namely, sputtering by DC plus superimposed AC leads to a substantially increased sputtering rate.

Next, the process is additionally and inventively operated in the transition mode UM.

Depending upon the operating process conditions, the transitions from the metallic into the reactive mode differ with respect to the "step height" or steepness of the transition slope. It has been inventively recognized, as mentioned, that the transition such as schematically shown at s, can be set to be more flat, i.e. less steep, by increasing the power of the AC portion. By means of this it is possible in certain cases to operate the process merely by holding the process conditions in the transition mode stable, i.e. without negative feedback control stabilization.

Again, it should be emphasized that the steps illustrated in FIGS. 1a and 1b are illustrative only and are not quantitative illustration of these transitions.

The stabilization in the transition mode is preferably made by a negative feedback control of the operating point of the process, known for DC-operation from the previously mentioned articles (4) or (9), now, however, applied to a DC with superimposed AC discharge process, i.e. in the range $UM_{AC+DC}$ such as illustrated at X, for example. It has been recognized that here, in the transition mode $UM_{AC+DC}$ a substantial increase of the reaction rate $\gamma$ is possible in comparison with the reaction rate $\gamma$ which can be reached at DC-operation in the transition mode.

From article (9) it is known that by application of pure alternating current (AC), sputtering at different power levels, hysteresis curves of sputtering rate and mass flow result in accordance with the illustration of FIG. 1b and that, in the set of such hysteresis curves, operating points of the processes which are located on a common straight line g extending through the point of origin of the coordinate system, are characterized by the same reaction rates $\gamma$ of the coating. Thus, such straight lines g are the loci of substantially the same reaction rates $\gamma$.

The inventive fact that, at a stabilized process in the transition mode, when operating the process with DC and superimposed AC, the reaction rate $\gamma$ can be considerably increased compared with DC-sputtering, may possibly be explained by the fact that, independently from the applied electrical power being DC alone or DC plus AC or AC alone, the operating points of the hysteresis curves which are located on straight lines running through the point of origin, are characterized by substantially the same reaction rates $\gamma$ of the coating.

Thus, in the illustration according to FIG. 1b, the reaction rate $\gamma$ at the step points $K_{DC}$ and $K_{AC+DC}$ are substantially the same, as located on the straight line $g_1$, and becomes maximal adjacent the reactive mode, corresponding to the straight line $g_2$. When a family or set G of straight lines is drawn such as designated in FIG. 1b, a gradation in the transition mode UM with respect to the rate of reaction $\gamma$ is thus represented.

The operating point of the process could, due to the process negative feedback control or stabilization, be set close to the reactive mode RM whereby, however, a distance D would have to then be maintained from the reactive mode RM in order to avoid that unintentionally, e.g. due to inherent deviations in the control process, a shift of the working point into the reactive mode could occur where the process conditions change drastically. An unwanted temporary shift of the process working point into the reactive mode RM would lead to the process remaining in that mode.

However, it can be seen that if the process is operated in accordance with the invention in the transition mode $UM_{AC+DC}$ and with DC superimposed with AC, a considerably higher reaction rate $\gamma_{max\ AC+DC}$ of the coating is possible than, at DC-operation, $\gamma_{max\ DC}$. From this it may be explained why inventively higher reaction rates $\gamma$ can be realized due to the stabilization provided, preferably by the said negative feedback control in a highly stable manner and thus homogeneously in the coating or layer on the workpiece.

The operating point X, stabilized 10 preferably by said controlling in the transition mode, can, as shown by the double arrow T in the illustration of FIG. 1b, be set along the transition mode according to a desired reaction rate $\gamma$, which reaction rate $\gamma$ will always be higher than in the case of DC-operation and at the same sputtering rate r. The reaction rate can be set in a controlled manner up to almost highest possible values corresponding to $\gamma_{max\ AC+DC} > \gamma_{max\ DC}$.

As was mentioned above, the explanations given up to now, are based on the well-known process characteristics which would have been expected to be important, especially as concerns the process characteristics at the transition mode UM.

It has further been recognized that if the working point of the inventively performed process is set closer to the metallic mode than to the reactive mode, always within the transition mode, the process may be operated with an optimally high deposition rate and that at least nearly stoichiometric layers or coatings are deposited. Thereby, it is valid that the energy yield ratio which, as was mentioned, is defined by the layer volume per sputtering energy of an inventively deposited layer to the layer volume per sputtering energy of a metal or conductive layer, deposited by DC-sputtering of the same conductive (metal) target material as inventively used, is larger than or equal to unity.

It has further been noted by the inventors that at least during inventive operation of the process, within the transition mode, the sputtering rate r follows, as a function of a reaction gas mass flow m*, the curve which has been qualitatively represented by the dotted line in FIG. 1b and that the partial pressure p of the reaction gas follows, as a function of the said reaction gas mass flow m*, qualitatively the dotted line curve as shown in FIG. 1a. Therefrom it is seen that in the proximity of the metallic mode $MM_{AC+DC}$ a higher sputtering rate and thus deposition rate is encountered, at a higher mass flow m* of reaction gas, but, as a function of said mass flow, at a substantially constant partial pressure p of reactive gas. As the spacing between the line 1 and the curve of partial pressure in FIG. 1a is a measure of the amount of reacted gas, it becomes evident that at a high reaction rate $\gamma$ the sputtering rate r becomes optimally high when the process working point $X_A$ is set closer to the metallic mode than to the reactive mode. In the range closer to the metallic mode there occurs, relative to the mass flow m*, a high consumption of reactive gas which is an indicia of the fact that the reaction rate $\gamma$ is high.

By the inventively performed DC and AC-sputtering and the setting of the working point $X_A$ of the process in the transition mode UM, preferably close to the metallic mode, in order to obtain an as large as possible reaction rate $\gamma$ at a high coating rate, a substantially increased deposition rate and reaction rate $\gamma$ of the layer is realized in comparison with a process stably operated at DC in the transition mode.

With the help of the fast negative feedback control loop drifting of the working point of the process into the metallic mode or possibly into the reactive mode is prevented.

Figure 2:
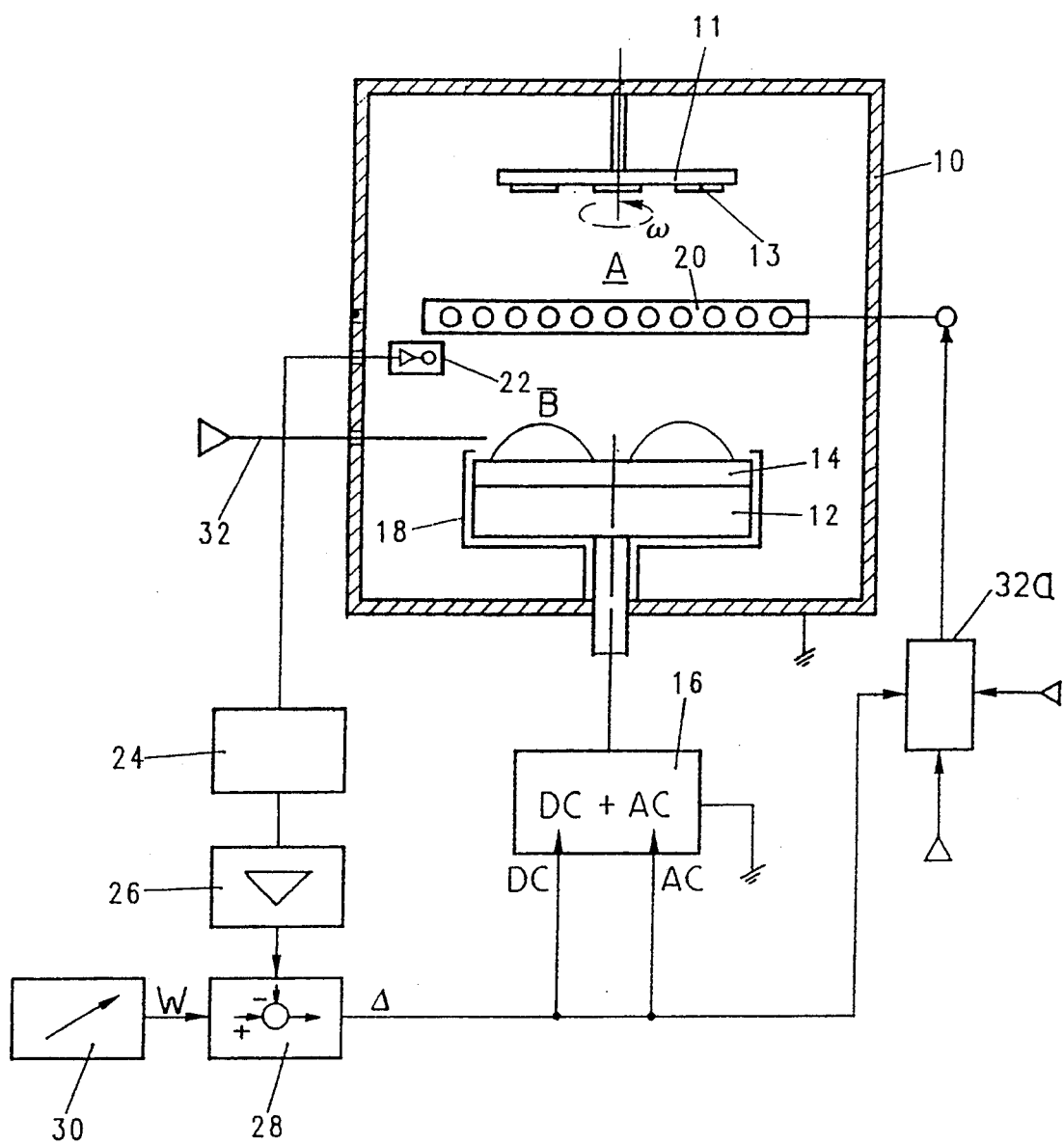
FIG. 2 illustrates schematically an apparatus in accordance with the invention.

FIG. 2 illustrates schematically an inventive apparatus for performing the inventive method. A workpiece support 11 with workpieces 13 is mounted in a vacuum chamber 10 electrically connected to ground. A target support 12 with a target 14 of an ohmically conductive material to be sputtered is mounted opposite to the workpiece support 11. The target 14 is connected via the support 12 to an electrical source 16 which generates a direct current signal DC with a superimposed alternating current signal AC. A gas feed system 20 opens into the reaction space A formed between the workpiece support 11 and the target 14. A dark space shield 18 also acts as anode. The gas feed system 20 comprises a plurality of inlet openings from which process gas, in which the reactive gas (such as oxygen) or gas mixtures is contained, is fed into space A. It has been found that frequencies of the AC-signal of source 16 of 50 Hz to 250 kHz, preferably 10 kHz to 200 kHz are extremely well suited for the process.

Depending upon the process, however, the alternating current portion AC is generated as impulses or as a pure sine signal or as superposition of two or more sine signals with different frequencies. Suitable frequencies are from 100 Hz or even 10 Hz up into the range of microwaves, but preferably up to about 15 MHz. The target, especially an inventive phosphorus doped Si-target which has been grown as a monocrystal or has been molded, preferably has an electrical conductivity in the range of 0.01 $\Omega$cm to 100 $\Omega$cm, preferably from 0.01 to 1$\Omega$cm. The AC-power is substantially lower than the DC-power which allows the use of an AC-generator in source 16 of reasonable cost and which is based on semiconductor elements.

The gas feed system 20 is supplied from containers (not illustrated) with the predetermined gas or gas mixture.

Furthermore, the glow discharge working gas, especially argon, can be fed in separately by the schematically illustrated further gas feed system 32.

The discharge working gas fed in by the gas feed system 32 may be fed in adjacent to the target and in an area which is shielded (not shown) from the reaction space A where the reaction occurs, as, for example, by a pressure stage, or may be fed in directly into the reaction space, according to a desired process to be performed by the inventive method, as is known from article (4).

A glow discharge is generated in the reaction space by means of the source 16 and the target 14 is thereby sputtered. The sputtered particles react in the process space A in the glow discharge with the reactive gas. The reaction product, being less conductive than the target material, e.g. dielectric, deposits as a coating or layer especially on the workpieces 13 arranged on the workpiece support 11.

According to the schematic illustration, a negative feedback control circuit for stabilizing sputtering and coating process is provided. It includes an actual value sensing device 22, including one or several sensors of the following kinds:
optical sensor,
absorption—and/or emission—and/or fluorescence spectrographic sensor,
sensor for detecting light emission,
plasma monitoring sensor such as manufactured and sold by the assignee of this invention,
discharge impedance sensor,
partial pressure sensor.

The output signal of the actual value sensing device 22 is sent to a conditioning and evaluating unit 24, 26. After the signal has been conditioned, the actual value signal S is led to a difference measuring unit 28. Here the control difference A relative to a preset rated value W is generated, which latter may be set by unit 30.

The control difference $\Delta$ acts via controllers (not illustrated) for optimizing the control of a process value, i.e. the regulated value, and which reacts speedily. Preferably, one or several of the following physical values listed below are used as the regulated value and are set by respective regulating means:
DC power (current and/or voltage),
DC power (amplitude of current and/or voltage),
AC frequency,
AC frequency spectrum,
ratio of AC power/DC power,
mass flow of reactive gas,
gas mixture,
mass flow of process gas (=working gas reactive gas).

According to FIG. 2, the DC and AC powers, and, via valve 32a, the mass flow of the reactive gas are regulated.

The sputtering and coating process in the transition mode $UM_{AC+DC}$ is stabilized preferably by means of the negative feedback control circuit as has been mentioned.

In order to further increase the density of the plasma adjacent the target and thus accordingly the sputtering rate, the target 14 is preferably operated as a magnetron source as schematically illustrated by the magnetic fields B.

In contrast to common coating apparatuses with target sputtering, here the target is operated at DC plus AC and, preferably, a fast acting control circuit is provided in order to stabilize the working point of the process.

If the obtained reaction rate $\gamma$ is not yet sufficient, the coating of the workpieces 13 is post-reacted. The layer can be post-reacted in a reactive gas in the chamber 10 itself, with or without a glow discharge, wherein preferably this post-reaction process is enhanced by additionally introduced energy (not illustrated), such as by:

light energy (laser, UV),
ion beam energy,
electron beam energy,
heating,
plasma energy,
Hf or microwave energy, coupled into chamber 10 by means of correspondingly appropriate devices. Post-reaction proceeds in a reaction gas environment of the same reactive gas.

The workpiece support is held stationary or is moved slowly or intermittently, preferably rotated.

It is possible and often preferred to couple the apparatus illustrated in FIG. 2 in line with a "post-reaction" chamber and to transport the workpieces 13 after sputter deposition into a post-reaction area coupled onto the chamber 10. By means of known pressure de-coupling, by means of load locks or merely by pressure stage, a substantial decoupling of the process pressure in the process space from the reactive gas pressure in such a post-treatment stage can be realized.

To perform the inventive method or operate the inventive apparatus in the transition mode at every desired working point, and especially near the transition into the metallic mode, one has to make sure that the process working point is not shifted by disturbing signals to such an amount that the process drops into the metallic mode. Such disturbing signals may be formed by random variations of the electric power feeding the glow discharge or by random variations of the reactive gas pressure or by material inhomogeneities of the target material and so on.

Figure 3A:
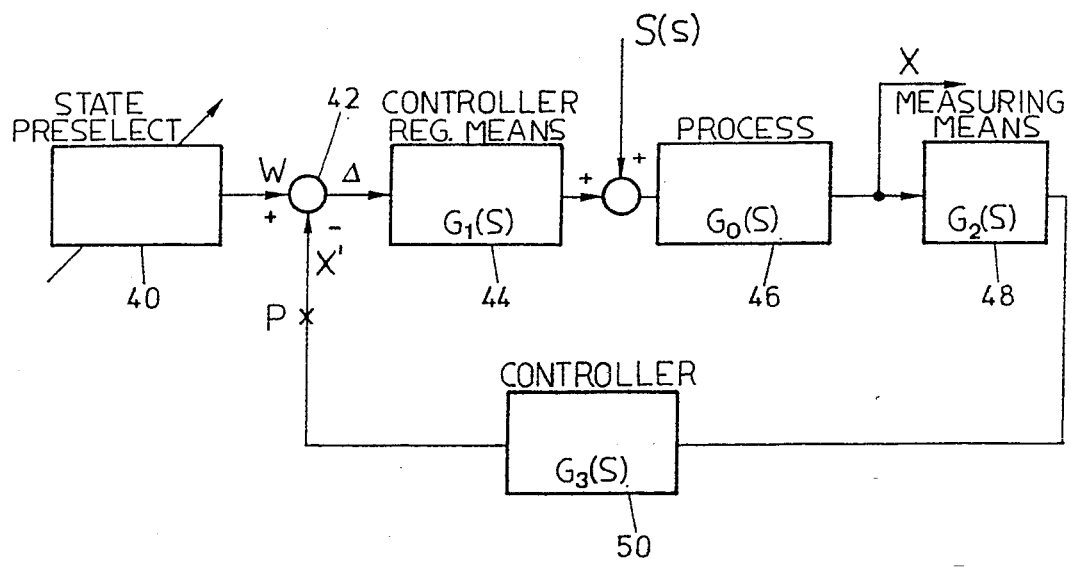
FIGS. 3a and 3b respectively show a block diagram of a negative feedback control loop as inventively applied and the qualitative amplitude response of the Bode-Diagram, of the open loop of the negative feedback control loop.

In FIG. 3a a block diagram of a negative feedback control circuit is shown as inventively provided. The block diagram of FIG. 3a corresponds with a negative feedback control loop for controlling predetermined physical values which define the working point of the process, whereby it might be advisable to use a state variable control system which is known per se in view of the complexity and multi-parameter function of the process.

Basically, a rated value or rated process state W is set at a state setting or rated value setting unit 40 and is compared at a comparing unit 42 with the measured value to be controlled, X', or the measured process state to be controlled, being negatively fed back to the unit 42. The control deviation or deviations act via a controller on regulating means 44, which latter regulates one or several of the process defining physical values so that the process is controlled at the working point. At 46 the process itself is shown as a controlled system, and the working point X of the process is the controlled value or entity. The said working point is sensed with a measuring unit 48, the output signal of the measuring unit 48 is sent, via controller 50, as the measured value X' to be controlled back into the comparing unit 42.

Disturbance signals or values S which might shift the working X or $X_A$ by an untolerable amount are shown to act on the control loop between regulating means 44 and process system 46. G(s) indicates the respective transfer functions wherein s is the variable of the Laplace transform as known by the man skilled in the art.

Figure 3B:
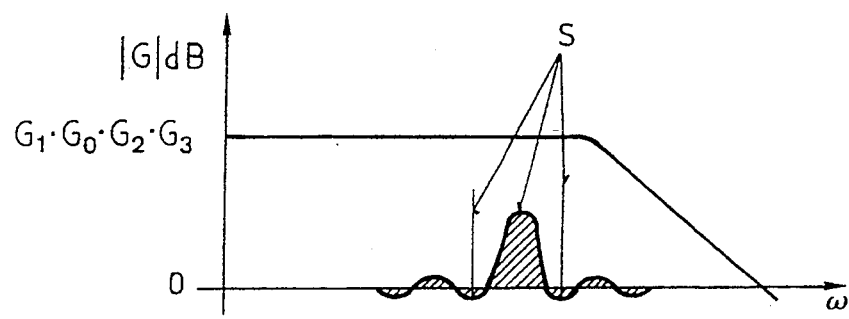

As is shown in FIG. 3b, the inventively implemented negative feedback control must show in its open loop configuration, i.e. between unit 40, W (FIG. 3a), and point P where it is opened, a gain which is significantly larger than 1 (OdB) up to frequencies at which disturbing signals S are expected, as shown schematically in FIG. 3b. If this condition is fulfilled, the disturbing signals S will be quickly compensated by the negative feedback control circuit and will not significantly influence the position of the working point X.

By means of an apparatus substantially as illustrated in FIG. 2 and the following process parameters the results as also listed below were obtained:

EXAMPLE

DC power: 2 kW
DC power: 0.5 kW
AC frequency: 200 kHz
voltage at the target: $-345$ V
current through the target: 7.2 A
Ar gas pressure: $8 \times 10^{-3}$ mbar
Ar gas flow: 16.5 sccm
$O_2$ partial pressure: $10^{-4}$ mbar
distance target to workpiece: 60 millimeters
target: conductivity $<0.5$ $\Omega$cm, phosphorus-doped Si, type AK 510 Si of assignee
magnetron system: MA 510 of the assignee
duration of sputtering; 1080 sec
thickness of layer: 583 nm
carrier for the substrates (workpieces): $\phi$ 400 millimeters
deposition rate on workpiece: 0.54 nm/sec
rotational frequency of carrier: 0.3 Hz
dynamic rate (DDR): DDR 32 60.5 nm·mm$^2$/Ws
energy yield: 0.6 ( nm/s )/(W/cm$^2$)
$SiO_z$ value of refractive index at $\lambda=633$ nm: n=1.465
$SiO_2$ absorption coefficient at $\lambda=633$ nm: $k<10^{-4}$
$SiO_2$ absorption coefficient at $\lambda=382$ nm: $1.5 \times 10^{-4}$
$F_{th}=2.5$; $F_{exp}=1.2$ It can be concluded:

The increased reaction rate obtained by DC +AC is indeed very advantageous for the layer formed on the workpiece and would, however, at DC alone, be equally detrimental to the target where a reactive gas containing layer would be produced in an increased manner leading to poisoning of the target. By an AC+DC discharge, contrary to a pure DC discharge, sputtering of the target is performed most effectively and a dielectric layer is deposited on the workpiece. A high gradient of the reaction rate between target and workpiece occurs. A low reaction rate at the target, i.e. a lower generation of a reaction gas containing layer leads to high deposition rates, a high reaction rate at the workpiece, and to homogeneous stoichiometric growth of the layer.

The gradient improves the energy yield defined as: "produced layer volume per expended energy" at sputter deposition of a layer formed by reactive process theoretically by the factor $F_{th}$ relative to the energy yield when sputter deposition of a metal layer (not reactive) is DC-performed. The following relations for the theoretically maximal possible ($F_{th}$) and experimentally measured ($F_{exp}$) improvement apply:

$$F_{th} = (Mr/Mm)/(Dr/Dm)$$

$$F_{exp} = (Vr/Er)/(Vm/Em)$$

(Mr=molecular weight of the layer formed by the inventive process; Mm=atomic weight of the metal; Dr and Dm, respectively, are density of the layer formed by the reactive process and of the metal layer; Vr and Vm are the volumes of the layer formed by the reactive process and of the metal layer, respectively; Er and Em, respectively, are the expenditures of energy, for sputtering in the reactive process and in the non-reactive metal deposition process, respectively.)

The energy yield was until now in the case of non-reactive metal sputtering higher and most significantly higher than in case of a reactive gas sputtering. In accordance with the invention, now, the energy yield in case of the reactive gas sputtering is higher than in case of the metal sputtering.

The inventive method as well as the apparatus for performing this method are also suited for the production of $Al_2O_3$ or $Si_3N_4$ layers derived from Al or Si targets, but are particularly suited for the production of $SiO_2$ layers derived from Si targets, especially derived from the inventively doped Si targets. With a high probability other non-conductive or low conductivity layers may also inventively be deposited with the advantages as discussed above. For determining the energy yield ratio, the same target material is sputtered in non-reactive and in reactive operation.

Figure 4A:
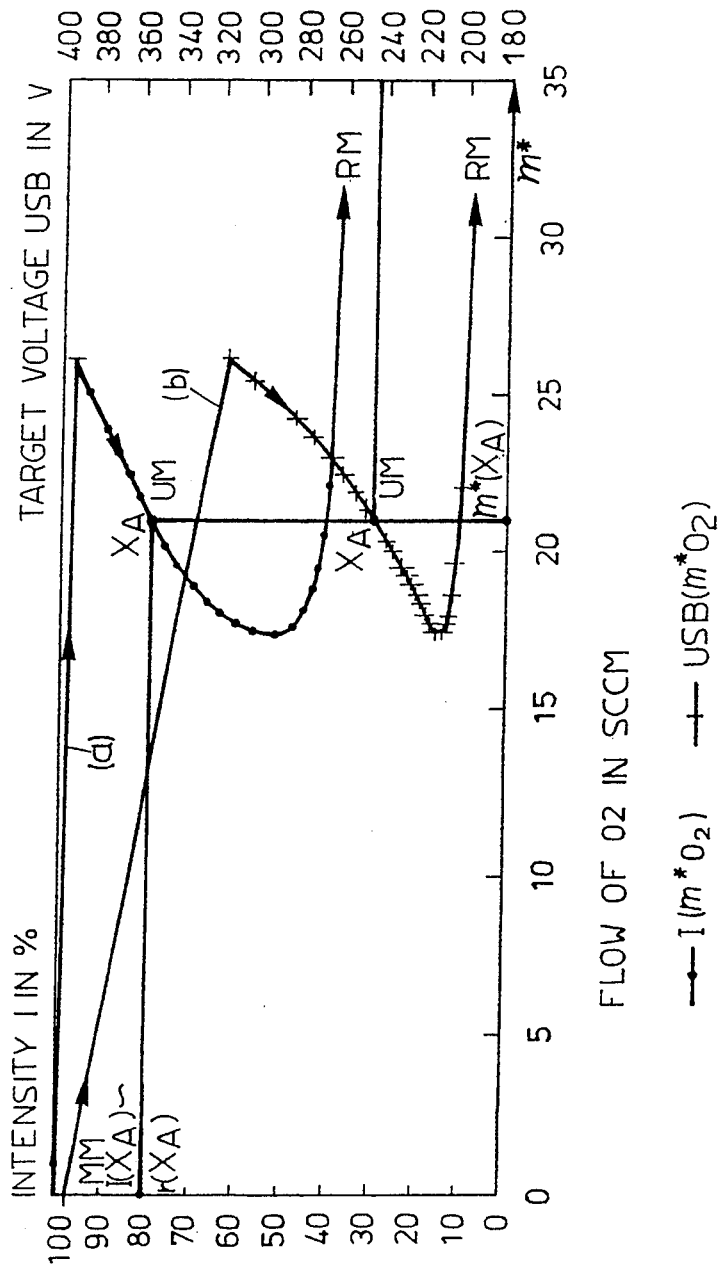
FIG. 4a is a plot showing along the left-hand vertical axis: intensity of Si-line, proportional to Si-sputter rate; along the horizontal axis: mass flow of reactive gas $O_2$; along the right-hand vertical axis: voltage of Si-target; and along the horizontal axis: mass flow of reactive gas $O_2$.
Figure 4B:
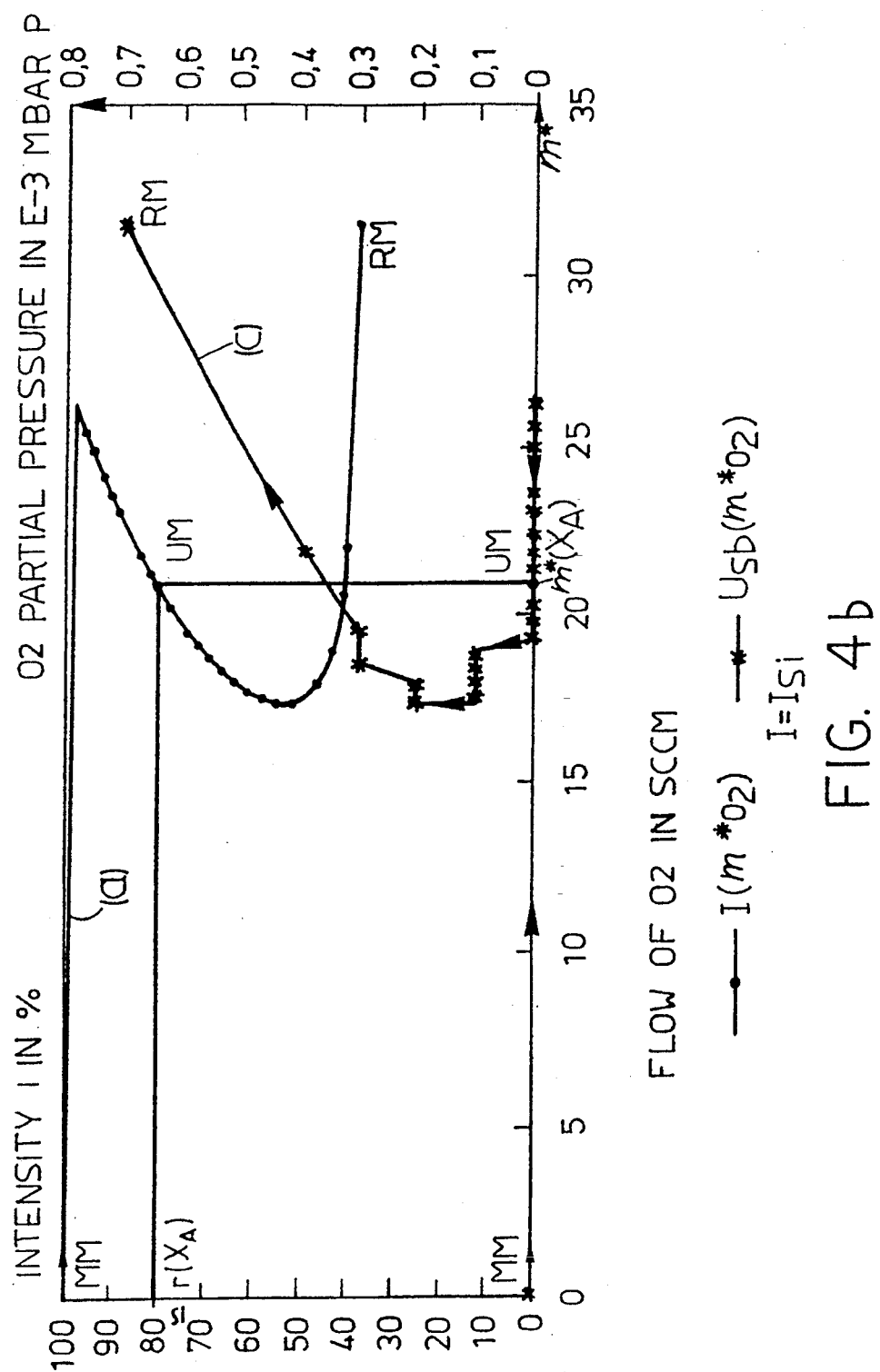
FIG. 4b is a plot showing along the left-hand vertical axis: intensity of Si-line, proportional to Si-sputter rate; along the horizontal axis: mass flow of reactive gas $O_2$; along the right-hand vertical axis: partial gas pressure of reactive gas $O_2$; and along the horizontal axis: mass flow of reactive gas $O_2$.

In FIGS. 4a and 4b the sputtering characteristics (a), (b), (c) are shown which arise during inventive sputtering of silicon to produce a layer of $SiO_2$ according to the preferred embodiment of the invention.

In FIGS. 4a and 4b in a first coordinate system with the left-hand vertical coordinate axis, the emission intensity I of the silicon line is shown in percent as a function of mass flow $m^*$ of the reactive gas $O_2$. The intensity I of the silicon line (at 254 nm) is proportional to the sputtering rate r of the silicon target. The process was performed in an apparatus as was described with respect to FIG. 2. The characteristic curve of the sputtering rate r, as a function of the mass flow $m^*$ of the reactive gas, is shown at (a). The points marked on the characteristic curve are measured points. The characteristic curve (a) was obtained in the direction indicated by the arrows. Further, the metallic mode MM, the transition mode UM, and the reactive mode RM are shown.

In FIG. 4b, in a second coordinate system, the right-handed vertical axis indicates the partial pressure p of reactive gas $O_2$, as a function of the mass flow $m^*$ of the reactive gas $O_2$. The characteristic curve is indicated by (c). The zero point of partial pressure has been selected as the pressure value of the argon gas in the chamber. Here, too, the characteristic curve (c) was obtained in the direction indicated by the arrows, and the measuring points are shown with a * symbol. Again, the metallic mode MM, the transition mode UM, and reactive mode RM are shown.

In FIG. 4a in the second coordinate system using the right-handed vertical axis there is shown the variation of the target voltage Usb as a function of the mass flow m, of the reactive gas $SiO_2$. Here, too, the measuring points and the direction with which the characteristic is obtained from measuring point to measuring point, are shown.

The characteristics according to FIGS. 4a and 4b show the behavior as described qualitatively with respect to FIG. 1 (dotted line). Attention should be drawn to the characteristic behavior in the transition mode UM where the characteristic of sputtering rate r, which is proportional to the intensity of silicon line I, has a positive slope with respect to mass flow $m^*$ of the reactive gas. Simultaneously and along a large range in this transition mode UM, the partial pressure p of the reactive gas $O_2$ is constant, as a function of the mass flow of reactive gas.

In FIGS. 4a and 4b a working point $X_A$ is marked as an example for a preferred setting of the process working point according to the present invention.

While there have been shown and described preferred embodiments of the invention, it is to be distinctly understood that the invention is not limited thereto but may be variously embodied and practiced within the scope of the following claims.

I claim:

1. Apparatus for coating workpieces, comprising a vacuum chamber with a target cathode arrangement adapted to include a target of ohmically conductive material and an anode arrangement, further comprising an electrical source connected to said anode and said cathode arrangements and generating an electric supply consisting of a DC component and a superimposed AC-component, which AC component has a predominant power in the frequency spectrum range below 250 kHz to generate a glow discharge within said vacuum chamber between said cathode and said anode arrangements; a workpiece carrier and at least one gas inlet for feeding a reactive gas into said vacuum chamber, whereby particles glow discharge sputtered from said target react with said gas and a reaction product is deposited on a workpiece on said workpiece carrier, and further comprising means to control sputtering and deposition within an unstable transition mode between a metallic mode and a reactive mode.

2. The apparatus according to claim 11 said control means comprising a fast negative feedback control loop circuit.

3. The apparatus according to claim 1, comprising means for measuring a physical signal representative of said sputtering and said deposition, the output of said measuring means being led to one input of a comparing means, the output of an adjustable signal source being led to a second input of said comparing means, the output of said comparing means being coupled to regulating means acting on a physical value significantly influencing said sputtering and deposition, the gain of a circuit between said signal source connected to said comparing means and the output of said measuring means, disconnected from said comparing means, being significantly larger than unity, up to frequencies at which disturbing signals are expected to influence said sputtering and depositing.

4. The apparatus according to claim 1, said electrical source connected to said cathode and anode arrangements generating an AC current component with a frequency spectrum, said frequency spectrum comprising components of predominant power in the frequency range between 50 kHz and 250 kHz, both inclusively.

5. The apparatus according to claim 1, said electrical source connected to said cathode and anode arrangements generating an AC current component with a frequency spectrum, said frequency components being disposed between 10 kHz and 200 kHz.

6. The apparatus according to claim 1, said means to control sputtering further comprising adjusting means being adjusted so that said sputtering and deposition is performed in said unstable mode nearer to the metallic mode than to the reactive mode.

7. The apparatus according to claim 6, said adjusting means being adjusted so that said sputtering and deposition result in a layer on said workpiece, so that the value of the ratio determined by the volume of said layer per electrical sputtering energy divided by the volume of a sputter deposited layer of material of said target per electrical sputtering energy therefor, is equal to or larger than unity.

8. The apparatus according to claim 7 wherein the value of said ratio is greater than unity.

9. The apparatus according to claim 1, comprising a negative feedback control circuit, said circuit comprising as a sensor for a physical value to be controlled at least one of the following means:
   optical measuring means,
   absorption measuring means,
   emission measuring means,
   fluorescence spectrographic means,
   plasma monitoring means,
   light monitor means,
   means for measuring discharge impedance,
   means for measuring gas partial pressure within said vacuum chamber, and
   plasma monitor means.

10. The apparatus according to claim 1, said means for controlling further comprising a negative feedback control loop, said loop comprising regulating means to regulate the controlled variable, said regulating means comprising at least one of the following means:
   means for regulating the power of said direct current component of said source,
   means for regulating the power of said AC-component of said source,
   means for regulating at least one of the power and the frequency of said AC component of said source,
   means for regulating the power ratio of the power of said DC and AC components, and
   means for regulating the gas mass flow of said gas inlet into said chamber.

11. The apparatus according to claim 1 wherein said electrical source generating said AC component comprises semiconductor means.

12. The apparatus according to claim 1, wherein said workpiece carrier is stationarily mounted.

13. The apparatus according to claim 1, further comprising driving means for rotationally driving said workpiece carrier with a rotational frequency substantially below a dominant frequency of said AC component generated by said electric source.

14. The apparatus according to claim 13, said rotational frequency being equal to or less than 1 Hz.

15. The apparatus according to claim 1, further comprising a post-reaction stage for post-reacting said coated workpiece without influencing said glow discharge sputtering.

16. The apparatus according to claim 15, said post-reaction stage being remote from said cathode and anode arrangements.

17. The apparatus according to claim 15 wherein said post-reaction stage comprises energy dispatch means dispatching additional energy to at least enhance said post-reaction.

18. The apparatus according to claim 17, wherein said post-reaction stage is connected to at least one of an ion source, an ultraviolet light source, a laser source, a plasma source, an electron source, a light source, a heat source, an rf source, and a microwave source.

19. The apparatus according to claim 1 further comprising means for intermittently moving said workpiece carrier.

* * * * *